United States Patent
Kim et al.

(10) Patent No.: US 10,629,812 B2
(45) Date of Patent: Apr. 21, 2020

(54) ELECTRODE, METHOD FOR MANUFACTURING THE SAME, AND ORGANIC LIGHT EMITTING DIODE DISPLAY INCLUDING THE SAME

(71) Applicants: SAMSUNG DISPLAY CO., LTD., Yongin-si, Gyeonggi-do (KR); UNIST (ULSAN NATIONAL INSTITUTE OF SCIENCE AND TECHNOLOGY), Ulsan (KR)

(72) Inventors: Young Chan Kim, Incheon (KR); Won Sang Park, Yongin-si (KR); Hye Yong Chu, Daejeon (KR); Jong Ho Hong, Yongin-si (KR); Si-Hoon Kim, Ulsan (KR); Ju-Young Kim, Ulsan (KR); Yun Seok Nam, Ulsan (KR); Myoung Hoon Song, Ulsan (KR)

(73) Assignees: Samsung Display Co., Ltd., Yongin-si (KR); UNIST (Ulsan National Institute of Science and Technology), Ulju-Gun (KR)

( * ) Notice: Subject to any disclaimer, the term of this patent is extended or adjusted under 35 U.S.C. 154(b) by 0 days.

(21) Appl. No.: 16/036,830

(22) Filed: Jul. 16, 2018

(65) Prior Publication Data
US 2018/0342677 A1    Nov. 29, 2018

Related U.S. Application Data

(62) Division of application No. 15/201,280, filed on Jul. 1, 2016, now abandoned.

(30) Foreign Application Priority Data

Jul. 7, 2015 (KR) .................. 10-2015-0096413

(51) Int. Cl.
H01L 51/00 (2006.01)
H01L 27/32 (2006.01)
(Continued)

(52) U.S. Cl.
CPC ...... H01L 51/0021 (2013.01); H01L 27/3244 (2013.01); H01L 51/003 (2013.01);
(Continued)

(58) Field of Classification Search
None
See application file for complete search history.

(56) References Cited

U.S. PATENT DOCUMENTS 5,108,201 A * 4/1992 Matsuura ........... C08G 73/1039
385/123
2005/0151820 A1 * 7/2005 Sirringhaus ............ B82Y 30/00
347/107
(Continued)

FOREIGN PATENT DOCUMENTS

| KR | 10-2012-0128155 A | 11/2012 |
| KR | 10-2013-0092639 A | 8/2013 |
| KR | 10-1420541 B1 | 7/2014 |

OTHER PUBLICATIONS

Liang et al., "Elastomeric polymer light-emitting devices and displays," Nature Photonics, Sep. 22, 2013, DOI: 101.038/NPHOTON.2013.242, pp. 817-824.
(Continued)

*Primary Examiner* — Seahvosh Nikmanesh
*Assistant Examiner* — Xiaoming Liu
(74) *Attorney, Agent, or Firm* — Lewis Roca Rothgerber Christie LLP

(57) ABSTRACT

An electrode includes: a polymer layer including a non-conductive material; a conductive nanomaterial embedded in a top surface of the polymer layer; and a planarization
(Continued)

layer on the polymer layer and on the conductive nanomaterial. The planarization layer includes a conductive material and a surfactant.

6 Claims, 8 Drawing Sheets

(51) Int. Cl.
  *H01L 51/56* (2006.01)
  *H01L 51/52* (2006.01)
  *H01L 51/44* (2006.01)

(52) U.S. Cl.
  CPC ........ *H01L 51/442* (2013.01); *H01L 51/5215* (2013.01); *H01L 51/5234* (2013.01); *H01L 51/56* (2013.01); *H01L 51/0022* (2013.01); *H01L 51/0037* (2013.01); *H01L 2251/301* (2013.01); *Y02E 10/549* (2013.01); *Y02P 70/521* (2015.11)

(56) References Cited

U.S. PATENT DOCUMENTS

| | | | |
|---|---|---|---|
| 2007/0074316 A1* | 3/2007 | Alden | B82Y 30/00 257/784 |
| 2013/0105770 A1* | 5/2013 | Pschenitzka | H01L 31/0232 257/40 |
| 2013/0251943 A1 | 9/2013 | Pei et al. | |
| 2014/0175407 A1 | 6/2014 | Pschenitzka | |
| 2014/0242343 A1 | 8/2014 | Free et al. | |
| 2015/0302948 A1 | 10/2015 | Hong et al. | |

OTHER PUBLICATIONS

Savagatrup et al. "Plasticization of PEDOT:PSS by Common Additives for Mechanically Robust Organic Solar Cells and Wearable Sensors," Advanced Functional Materials 2014, DOI: 10.1002/adfm.201401758, pp. 1-10.

Savagatrup et al. "Plasticization of PEDOT:PSS by Common Additives for Mechanically Robust Organic Solar Cells and Wearable Sensors," Advanced Functional Materials 2015, 25, pp. 427-436.

* cited by examiner

ELECTRODE, METHOD FOR MANUFACTURING THE SAME, AND ORGANIC LIGHT EMITTING DIODE DISPLAY INCLUDING THE SAME

CROSS-REFERENCE TO RELATED APPLICATION

This application is a divisional of U.S. patent application Ser. No. 15/201,280, filed Jul. 1, 2016, which claims priority to and the benefit of Korean Patent Application No. 10-2015-0096413, filed Jul. 7, 2015, the entire content of both of which is incorporated herein by reference.

BACKGROUND

1. Field

Embodiments of the present invention relate to an electrode, a method for manufacturing the same, and an organic light emitting diode (OLED) display including the same.

2. Description of the Related Art

Recently, display devices, mobile phones, digital gadgets, and information technology (IT) devices, in which display and memory elements (or components) are mounted on a flexible substrate to provide improved portability and mobility, have been developed. In addition, because industries and markets for transparent displays have recently expanded, substrates and materials for transparent displays, which are transparent, conductive, and flexible, have been actively developed. In a circuit structure for manufacturing transparent displays, an electrode material should provide excellent transparency, and for this purpose indium tin oxide (ITO) is widely used as an electrode material. However, due to ITO's low electric conductivity and vulnerable characteristics, metal nanowire technology represented by silver (Ag) nanowire is receiving much attention in the field of manufacturing OLEDs.

To manufacture components, such as an OLED and the like, multiple organic layers or inorganic layers are thinly coated on a transparent electrode that is on a substrate, in which case if the electrode's surface is not flat, the final device may have problems, such as a short circuit and/or the like due to the layers being very thin. Accordingly, when a device is desired to be manufactured by forming a transparent electrode with a conductive material, such as metal nanowires or carbon nanotubes, it is important that surface roughness be low (i.e., the surface should be smooth). Generally, in the related art, metal nanowires or carbon nanotubes are directly dissolved in water or in various suitable organic solvents to produce suspension, and are wet-coated on the substrate, in which case a diameter of a nanomaterial, such as nanowires, is thick, and roughness is prone to deteriorate at portions where the metal nanowires or carbon nanotubes overlap each other, thereby making it difficult to manufacture the device.

The above information disclosed in this Background section is only to enhance the understanding of the background of the invention, and therefore may contain information that does not form prior art.

SUMMARY

Embodiments of the present invention provide an electrode having excellent surface roughness and conductivity, a method for manufacturing the same, and an organic light emitting diode (OLED) display including the same.

An exemplary embodiment of the present invention provides an electrode including a polymer layer including a non-conductive material, a conductive nanomaterial embedded in a top surface of the polymer layer, and a planarization layer on the polymer layer and on the conductive nanomaterial. The planarization layer includes a conductive material and a surfactant.

The planarization layer may further include polyethylenedioxythiophene:polystyrenesulfonate (PEDOT:PSS) and a fluorine-based surfactant.

The conductive nanomaterial may include a metal nanowire.

The metal nanowire may include at least one of silver (Ag), copper (Cu), gold (Au), platinum (Pt), palladium (Pd), chromium (Cr), nickel (Ni), and aluminum (Al).

The conductive nanomaterial may be embedded in the polymer layer in an amount of about 0.05% volume to about 20% volume of a total volume of the polymer layer.

The polymer layer may include at least one of polyimide (PI), polyethylene terephthalate (PET), polyethersulfone (PES), polyethylene naphthalate (PEN), polycarbonate (PC), polymethyl methacrylate (PMMA), polyvinyl alcohol (PVA), triacetyl cellulose (TAC), polystyrene (PS), polyether imide (PEI), polydimethylsiloxane (PDMS), a silicone resin, a fluorine resin, and an epoxy resin.

In addition, another exemplary embodiment of the present invention provides a method of manufacturing an electrode including forming a planarization layer including a conductive material and a surfactant on a substrate, coating a conductive nanomaterial on the planarization layer, forming a polymer layer by coating and curing a curable polymer on the planarization layer and on the conductive nanomaterial, and removing the substrate.

Prior to forming the planarization layer, the method may further include forming a sacrificial layer including a hydrophobic material on the substrate.

The sacrificial layer may include at least one of polymethyl methacrylate (PMMA), a photosensitive polymer (PR), and polyvinyl phenol (PVP).

The curable polymer may be cured by heat treatment for about 90 min. to about 150 min. at 65° C. to 75° C.

In addition, a further exemplary embodiment of the present invention provides an OLED display including a substrate, a thin film transistor on the substrate, a first electrode electrically coupled to the thin film transistor, a light-emitting element layer on the first electrode, and a second electrode on the light-emitting element layer, wherein at least one of the first electrode and the second electrode includes a polymer layer of a non-conductive material, a conductive nanomaterial embedded in a top surface of the polymer layer, and a planarization layer on the polymer layer and on the conductive nanomaterial. The planarization layer includes a conductive material and a surfactant.

As described above, according to the exemplary embodiment of the present invention, the planarization layer including a conductive material can be formed at the electrode's surface, and the sacrificial layer including a hydrophobic material can be used in a manufacturing process of the electrode, thereby improving surface roughness and conductivity.

DETAILED DESCRIPTION

Figure 1:
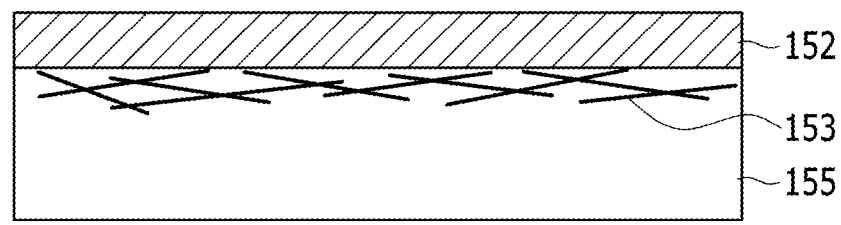
FIG. 1 is a cross-sectional view of an electrode according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various suitable ways, all without departing from the spirit or scope of the present invention.

In the drawings, the thickness of layers, films, panels, regions, etc. are exaggerated for clarity. Like reference numerals designate like elements (or components) throughout the specification.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" or between "1.0 and 10.0" are intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

An electrode according to an exemplary embodiment of the present invention will now be described in detail with reference to the drawings.

First, referring to FIG. 1, an electrode according to an exemplary embodiment of the present invention will be described in detail.

FIG. 1 is a cross-sectional view of an electrode according to an exemplary embodiment of the present invention. In this case, the electrode according to the exemplary embodiment of the present invention may be a transparent electrode.

Referring to FIG. 1, the electrode according to the exemplary embodiment of the present invention includes a non-conductive polymer layer 155 and a conductive nanomaterial 153 at a top surface of the polymer layer 155 and embedded therein. Some of the nanomaterial 153 may be exposed at the top surface of the polymer layer 155. In addition, the electrode according to the exemplary embodiment of the present invention further includes a planarization layer 152 covering the nanomaterial 153 that is partially exposed at the top surface of the polymer layer 155. The planarization layer 152 may include a conductive material.

The electrode may consist of a double layer structure of the non-conductive polymer layer 155 and the planarization layer 152. Further, the electrode according to the current exemplary embodiment may include the conductive nanomaterial 153 that is embedded in the top surface of the non-conductive polymer layer 155.

The conductive nanomaterial 153 according to the current exemplary embodiment may be randomly distributed at the top surface of the non-conductive polymer layer 155. A volume of the conductive nanomaterial 153 may be about 0.05% to about 20% of the total volume of the polymer layer 155, and when the volume of the conductive nanomaterial 153 is within such a range, the electrode may be transparent or semi-transparent while having excellent electrical characteristics.

Some of the nanomaterial 153 at the top surface of the polymer layer 155 inside the polymer layer 155 may be exposed at the top surface of the polymer layer 155, and the electrode's surface may be made flat by the planarization layer 152 on the polymer layer 155.

Even though the nanomaterial 153 may be partially exposed at the top surface of the polymer layer 155, the electrode's surface may be flatly formed by the planarization layer 152. Accordingly, because the electrode according to the current exemplary embodiment has a surface that is flat, when manufacturing electrical components having a structure in which thin films are laminated, excellent adhesiveness can be provided, and electrical performance, such as prevention of a short-circuiting between the electrical components, can be improved.

The polymer layer 155 is a curable polymer that can be used as a material for forming the substrate, and does not have conductivity. For example, the polymer layer 155 may include at least one of polyimide (PI), polyethylene terephthalate (PET), polyethersulfone (PES), polyethylene naphthalate (PEN), polycarbonate (PC), polymethyl methacrylate (PMMA), polyvinyl alcohol (PVA), triacetyl cellulose (TAC), polystyrene (PS), polyether imide (PEI), polydimethylsiloxane (PDMS), a silicone resin, a fluorine resin, and an epoxy resin.

The conductive nanomaterial 153 may be a metal nanowire. For example, the metal may be silver (Ag), copper (Cu), gold (Au), platinum (Pt), palladium (Pd), chromium (Cr), nickel (Ni), aluminum (Al), or a combination of these metals. Among metal nanowires, an Ag nanowire having excellent conductivity may be used, but the present invention is not limited thereto.

When using the metal nanowire as the conductive nanomaterial 153, due to a metal's excellent conductivity and a high aspect ratio, high conductivity is realized with only a small amount of the metal nanowire, and a high level of optical transmissivity may be obtained because the metal nanowire occupies little volume or area.

Alternatively, the nanomaterial 153 may be a nanorod or a carbon material. For example, the carbon material may be a carbon nanotube (CNT), a carbon fiber, or a combination thereof, but the present invention is not limited thereto.

The planarization layer 152 may include a conductive material and a surfactant, and may have a conductive property. For example, the planarization layer 152 may include a conductive material, such as polyethylenedioxythiophene: polystyrenesulfonate (PEDOT:PSS), and may include a surfactant such as a fluorine-based surfactant, although the planarization layer 152 is not limited thereto.

Polyethylenedioxythiophene:polystyrenesulfonate (PEDOT:PSS) is easily soluble in water by doping a dopant, such as polyethylenedioxythiophene (PEDOT), with polystyrenesulfonate (PSS), and is superior in terms of thermal stability. In addition, polyethylenedioxythiophene:polystyrenesulfonate (PEDOT:PSS) may be diluted with a solvent, and may then be easily coated by being mixed with a solvent having a high dielectric constant, and, even when a coating layer is formed, may exhibit excellent transparency compared to other suitable conductive polymers, such as polyaniline-based polymers or polypyrrole-based polymers.

In addition, the surfactant may, in a manufacturing process of the electrode to be described below, serve to easily separate the substrate 150 and a sacrificial layer 151 (See FIG. 2) from the electrode.

A manufacturing process of an electrode according to an exemplary embodiment of the present invention will now be described in detail with reference to FIGS. 2 through 4.

Figure 2:
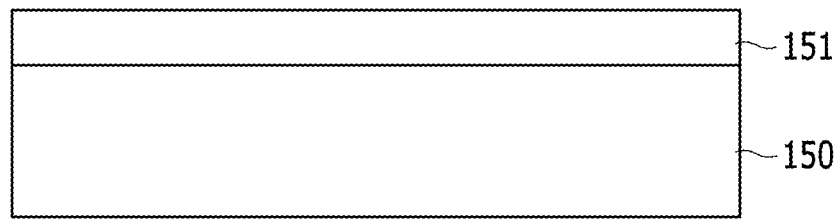
FIGS. 2, 3, and 4 are cross-sectional views sequentially illustrating a manufacturing process of an electrode according to an exemplary embodiment of the present invention.
Figure 3:
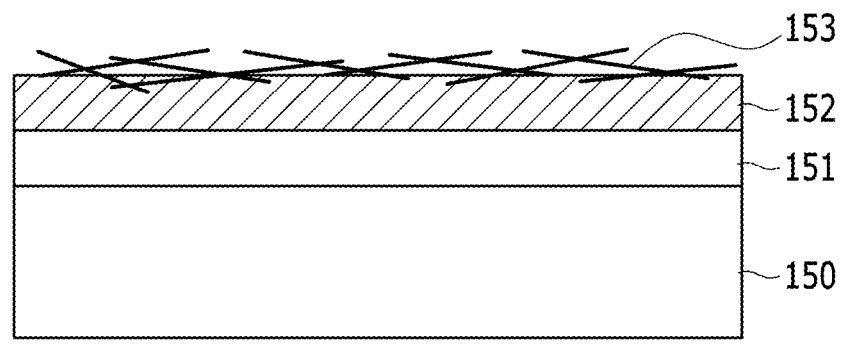
Figure 4:
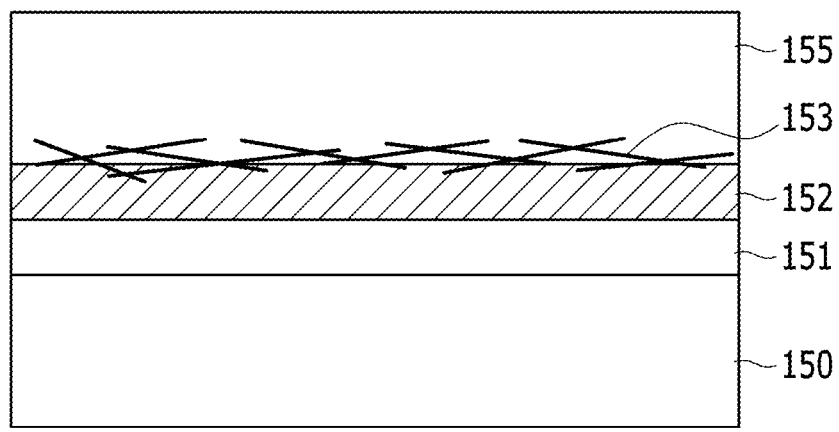

FIGS. 2 through 4 are cross-sectional views sequentially illustrating a manufacturing process of an electrode according to an exemplary embodiment of the present invention.

First, referring to FIG. 2, a sacrificial layer 151 including an organic material is formed on a substrate 150.

The substrate 150 may be formed of various suitable organic and inorganic materials, such as glass, silicon, silicon oxide, polyimide (PI), polyethylene terephthalate (PET), and/or polyethersulfone (PES).

Prior to forming the sacrificial layer 151, a cleansing operation may be added for removing impurities on a surface of the substrate 150 to effectively form the sacrificial layer 151. In this case, various suitable dry or wet processes may be applicable to the cleansing operation without any limitation.

The sacrificial layer 151 including an organic material may be formed of a hydrophobic material such as polymethyl methacrylate (PMMA), a photosensitive polymer (PR), polyvinyl phenol (PVP), etc. In an example embodiment the sacrificial layer 151 is formed of polymethyl methacrylate (PMMA).

After forming the sacrificial layer 151 on the substrate 150, a dry or curing process may additionally be performed.

Next, referring to FIG. 3, a planarization layer 152 is formed on the sacrificial layer 151 that is formed on the substrate 150, and a nanomaterial 153 is randomly coated on top of the planarization layer 152.

The planarization layer 152 may include a conductive material and a surfactant, and may have a conductive property. For example, the planarization layer 152 may include a conductive material, such as polyethylenedioxythiophene:polystyrenesulfonate (PEDOT:PSS), and may include a surfactant, such as a fluorine-based surfactant, although the planarization layer 152 is not limited thereto.

The nanomaterial 153 formed on the planarization layer 152 may be a metal nanowire. For example, the metal may be silver (Ag), copper (Cu), gold (Au), platinum (Pt), palladium (Pd), chromium (Cr), nickel (Ni), aluminum (Al), or a combination of these metals. Among metal nanowires, an Ag nanowire having excellent conductivity may be used, although the present invention is not limited thereto, and a nanorod or a carbon material may be alternatively used.

The nanomaterial 153 may be formed by coating suspension including the nanomaterial 153 on the planarization layer 152.

After coating the suspension including the nanomaterial 153 on the planarization layer 152, a drying process may be additionally performed. A solvent on the suspension is removed by the drying process, and the nanomaterial 153 may be present on the planarization layer 152 while being exposed to the outside.

Next, referring to FIG. 4, a polymer layer 155 is formed by coating a curable liquid polymer on the planarization layer 152.

The operation of forming the polymer layer 155 is an operation of coating a curable liquid crystal (LC) polymer on the nanomaterial 153 that is formed at an upper part of the planarization layer 152 on top of the substrate 150, such that the nanomaterial 153 formed at the upper part of the electrode may be embedded in the polymer layer 155.

Any curable polymer may be used as long as it is manufactured as a liquid type. For example, the curable polymer for forming the polymer layer 155 may be polyimide (PI), polyethylene terephthalate (PET), polyether sulfone (PES), polyethylene naphthalate (PEN), polycarbonate (PC), polymethyl methacrylate (PMMA), polyether imide (PEI), polydimethylsiloxane (PDMS), a silicone resin, a fluorine resin, an epoxy resin, or a combination thereof.

The sacrificial layer 151, the planarization layer 152, the nanomaterial 153, and the polymer layer 155 may be coated using a method, such as spin coating, bar coating, slit coating, roll coating, off-set coating, etc.

An operation of curing the polymer layer 155 formed on top of the planarization layer 152 may be performed by heat treating the polymer layer 155 at about 65-75° C. for about 90-150 minutes.

Next, the sacrificial layer 151 and the substrate 150 are removed from the layered structure that is formed, thereby completing the electrode according to the exemplary embodiment of the present invention illustrated in FIG. 1.

When manufacturing the electrode according to the manufacturing process of the electrode in FIG. 2 through FIG. 4, as described above, when compared with a case in which the planarization layer 152 is not formed, the nanomaterial 153 is not entirely embedded in the polymer layer 155 due to an attraction to the substrate 150. The planarization layer 152, however, prevents the nanomaterial 153 from being present on the substrate 150. In this case, the nanomaterial 153 may be a metal nanowire, a metal of which includes at least one of silver (Ag), copper (Cu), gold (Au), platinum (Pt), palladium (Pd), chromium (Cr), nickel (Ni), and aluminum (Al). In addition, the polymer layer 155 may be a curable polymer having conductivity, which includes polyimide (PI), polyethylene terephthalate (PET), polyethersulfone (PES), polyethylene naphthalate (PEN), polycarbonate (PC), polymethyl methacrylate (PMMA), polyvinyl alcohol (PVA), triacetyl cellulose (TAC), polystyrene (PS), polyether imide (PEI), polydimethylsiloxane (PDMS), a silicone resin, a fluorine resin, and/or an epoxy resin.

That is, when manufacturing a typical transparent electrode, as opposed to the manufacturing process of the electrode according to the current exemplary embodiment, processes of forming the planarization layer 152 and the sacrificial layer 151 are omitted. When the processes of forming the planarization layer 152 and the sacrificial layer 151 are omitted, some of the nanomaterial 153 may not be completely embedded in the polymer layer 155, but may instead be present on the substrate 150. However, according to the manufacturing process of the electrode in accordance with the current exemplary embodiment, part of the nanomaterial 153 may be completely embedded in the polymer layer 155 by the processes of forming the planarization layer 152 and the sacrificial layer 151.

In addition, a surface, which is not uniform due to the nanomaterial 153 being partially exposed at the top surface of the polymer layer 155, may instead be flatly formed by the planarization layer 152.

In addition, when the sacrificial layer 151 formed of a material having a hydrophobic property directly contacts the substrate 150, it may prevent or reduce processing defects that occur as humidity changes in the planarization layer 152 having wettability.

However, in the manufacturing process of the electrode according to an exemplary embodiment of the present invention, the operation of forming the sacrificial layer 151 may be omitted.

Figure 5:
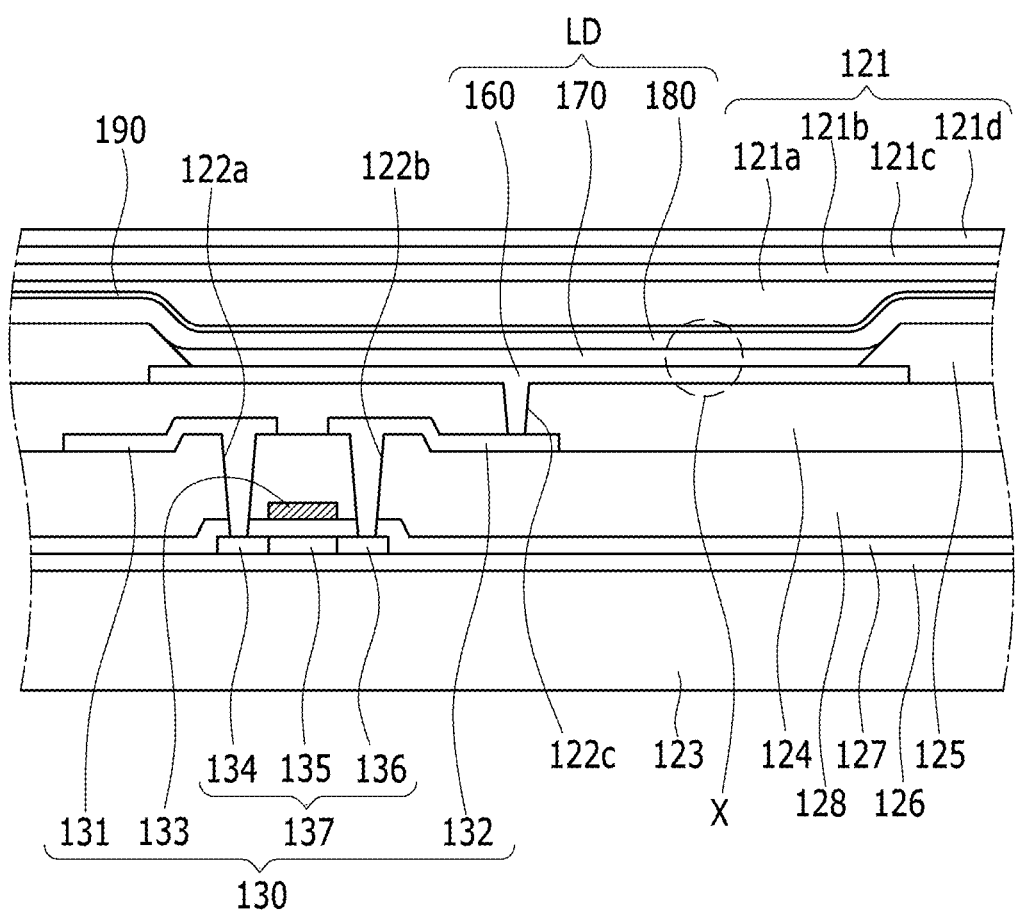
FIG. 5 is a cross-sectional view of an organic light emitting diode (OLED) display according to the exemplary embodiment of the present invention.

FIG. 5 is a cross-sectional view of an OLED display according to an exemplary embodiment of the present invention.

Referring to FIG. 5, an organic light emitting diode (OLED) display including an electrode according to an exemplary embodiment of the present invention will now be described in detail. The OLED display according to the current exemplary embodiment of the present invention includes an insulation substrate 123, a thin film transistor 130, a first electrode 160, a light-emitting element layer 170, and a second electrode 180.

The first electrode 160 may be an anode, and the second electrode 180 may be a cathode, or alternatively, the first electrode 160 may be a cathode, and the second electrode 180 may be an anode.

In this case, the insulation substrate 123 is formed as an insulating substrate including glass, quartz, ceramic, and/or plastic. However, the exemplary embodiment of the present invention is not limited thereto, the insulation substrate 123 may be formed as a metallic substrate including stainless steel and/or the like, and it may include an organic material such as polycarbonate, polymethyl methacrylate, polyethylene terephthalate, polyethylene naphthalate, polyimide, polyether sulfone, polyimide, or a combination thereof, silicon wafer, etc.

In addition, a substrate buffer layer 126 may be formed on the insulation substrate 123. The substrate buffer layer 126 serves to reduce or prevent penetration of impure elements, and to planarize a surface of the substrate 123. In this case, the substrate buffer layer 126 may be formed of various suitable materials that can perform the functions described above. For example, any one of a silicon nitride (SiNx) layer, a silicon oxide (SiOy) layer, and a silicon oxynitride (SiOxNy) layer may be used as the substrate buffer layer 126. However, the substrate buffer layer 126 may be omitted depending on a kind of the insulation substrate 123 and processing conditions.

A driving semiconductor layer 137 may be formed on the substrate buffer layer 126 as a polysilicon layer. In addition, the driving semiconductor layer 137 includes a channel region 135 where no impurity is doped, and source and drain regions 134 and 136 at respective sides of the channel region 135 where impurities are doped. In this case, a doped ion material is a P-type impurity such as boron (B), and $B_2H_6$ may be used. In this case, the impurities may vary depending on kinds of the thin film transistors.

A gate insulating layer 127 that is made of a silicon nitride (SiNx) or a silicon oxide (SiOy) is formed on the driving semiconductor layer 137. A gate wire including a driving gate electrode 133 is formed on the gate insulating layer 127. In addition, the driving gate electrode 133 may be formed to at least partially overlap the driving semiconductor layer 137, particularly, the channel region 135 thereof.

An interlayer insulating layer 128 covering the driving gate electrode 133 is formed on the gate insulating layer 127. A first contact hole 122a and a second contact hole 122b respectively exposing the source and drain regions 134 and 136 of the driving semiconductor layer 137 are formed in the gate insulating layer 127 and in the interlayer insulating layer 128. The interlayer insulating layer 128 may include a ceramic-based material, such as a silicon nitride (SiNx) or a silicon oxide (SiOy), as in the gate insulating layer 127.

In addition, a data wire, which includes a driving source electrode 131 and a driving drain electrode 132, is formed on the interlayer insulating layer 128. The driving source electrode 131 and the driving drain electrode 132 are connected to the source and drain regions 134 and 136 of the driving semiconductor layer 137, respectively, via the first and second contact holes 122a and 122b, respectively, which are formed in the interlayer insulating layer 128 and the gate insulating layer 127.

As such, the driving thin film transistor 130 is formed by including the driving semiconductor layer 137, the driving gate electrode 133, the driving source electrode 131, and the driving drain electrode 132. The configuration of the driving thin film transistor 130 is not limited to the example described above, and can be variously suitably modified in accordance with the disclosed configurations that can be easily practiced by those skilled in the art.

In addition, a passivation layer 124 covering the data wire is formed on the interlayer insulating layer 128. The passivation layer 124 serves to planarize a surface to increase emission efficiency of an organic light-emitting element to be formed thereon. In addition, the passivation layer 124 includes a third contact hole 122c that partially exposes the drain electrode 132.

The passivation layer 124 may include least one of a polyacrylate resin, an epoxy resin, a phenolic resin, a polyimide resin, a polyimide resin, an unsaturated polyester resin, a polyphenylene ether resin, a polyphenylene sulfide resin, and benzocyclobutene (BCB).

The present invention is not limited to the aforementioned structure, and the passivation layer 124 and/or the interlayer insulating layer 128 may be omitted.

In this case, a first electrode 160 of the organic light emitting element is formed on the passivation layer 124. The first electrode 160 may be a pixel electrode. That is, the OLED display includes a plurality of first electrodes 160 that are respectively disposed in a plurality of pixels. In this case, the first electrodes 160 are disposed to be spaced from each other. The first electrode 160 is connected to the drain electrode 132 via the third contact hole 122c in the passivation layer 124.

In addition, a pixel defining layer 125 having an opening for exposing the first electrode 160 is formed on the passivation layer 124. That is, the pixel defining layer 125 defines a plurality of openings that respectively correspond to the pixels. In this case, a light-emitting diode layer 170 (e.g., an organic emission layer 170) may be formed in each opening defined by the pixel defining layer 125. Accordingly, a pixel area in which each organic emission layer is formed by the pixel defining layer 125 may be defined.

In this case, the first electrode 160 is disposed to correspond to the opening of the pixel defining layer 125. However, the first electrode 160 is not necessarily disposed only in the opening of the pixel defining layer 125, but may be partially disposed under the pixel defining layer 125 such that the first electrode 160 partially overlaps the pixel defining layer 125.

The pixel defining layer 125 may include a polyacrylate resin, a polyimide resin, and/or a silica-based inorganic material.

Meanwhile, a light-emitting element layer 170 is formed on the first electrode 160. The light-emitting element layer 170 may include a structure in which a hole injection layer, a hole transporting layer, an emission layer, an electron transporting layer, and an electron injection layer are laminated.

In addition, a second electrode 180 may be formed on the light-emitting element layer 170. The second electrode 180 may be a common electrode. As such, an organic light emitting element LD including the first electrode 160, the light-emitting element layer 170, and the second electrode 180 is formed.

In this case, because at least one of the first electrode 160 and the second electrode 180 may be the same or substantially the same as the electrode described above in reference to FIG. 1 through FIG. 4, a duplicate description thereof may be omitted.

An overcoat 190 covering and protecting the second electrode 180 may be formed as an organic layer on the second electrode 180.

In addition, a thin film encapsulation layer 121 may be formed on the overcoat 190. The thin film encapsulation layer 121 seals and protects the organic light emitting element LD and the driving circuit formed on the insulation substrate 123 from the outside.

The thin film encapsulation layer 121 includes organic encapsulation layers 121a and 121c and inorganic encapsulation layers 121b and 121d that are alternately laminated one by one. FIG. 5 illustrates a case in which two organic encapsulation layers 121a and 121c and two inorganic encapsulation layers 121b and 121d are alternately laminated one by one to form the thin film encapsulation layer 121, but the present invention is not limited thereto.

Hereinafter, light transmittance of the electrode according to the exemplary embodiment of the present invention will be described with reference to FIGS. 6A and 6B.

Figure 6A:
FIGS. 6A and 6B are photographs of the electrode according to the exemplary embodiment of the present invention.
Figure 6B:

FIGS. 6A and 6B are photographs of the electrode according to the exemplary embodiment of the present invention, FIG. 6A illustrates the electrode before removal of the substrate 150 and the sacrificial layer 151 in the manufacturing process of the electrode according to the current exemplary embodiment, and FIG. 6B illustrates the electrode after removal of the substrate 150 and the sacrificial layer 151 according to the exemplary embodiment of the present invention.

As shown in FIGS. 6A and 6B, the electrode according to the exemplary embodiment of the present invention has an improved property of transmitting light, thereby confirming that a transparent electrode is formed.

Next, referring to FIG. 7, results of experiments for how sheet resistance varies according to a bending cycle of the electrode in accordance with the exemplary embodiment of the present invention will be described.

Figure 7:
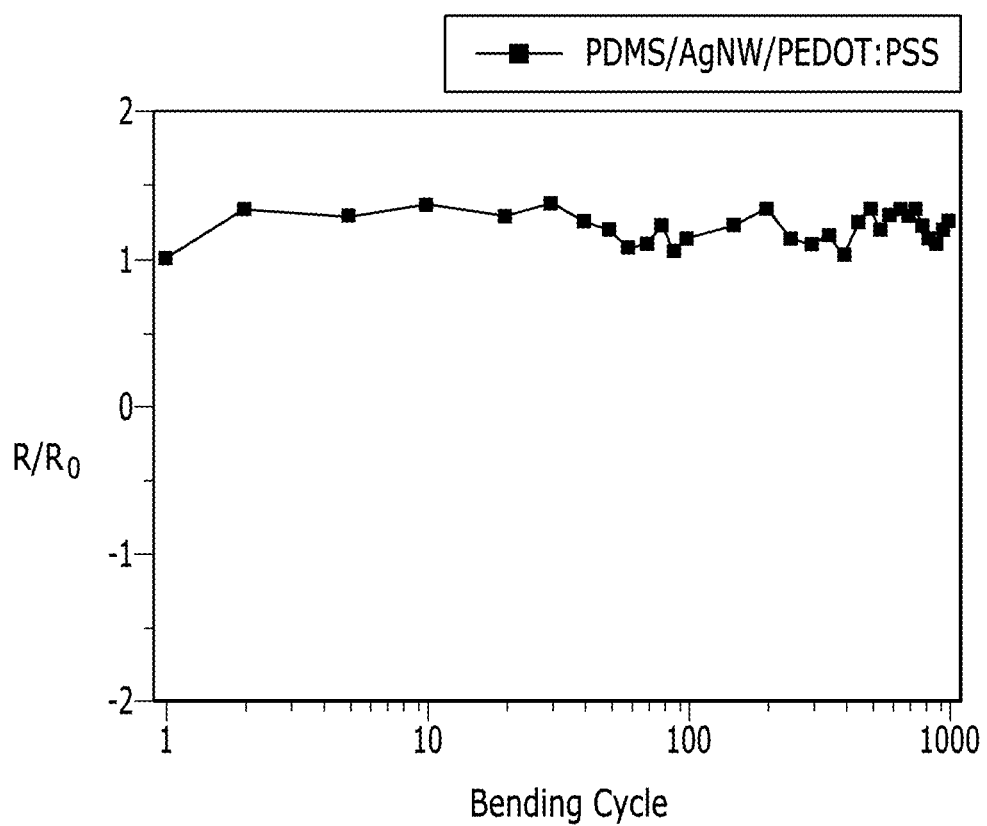
FIG. 7 shows a graph of measurement results for how electrical resistance of the electrode varies according to a bending cycle thereof in accordance with the exemplary embodiment of the present invention.

FIG. 7 shows a graph of measurement results for how electrical resistance of the electrode varies according to a bending cycle thereof in accordance with the exemplary embodiment of the present invention.

A horizontal axis of the graph shown in FIG. 7 represents the number of bends, and a vertical axis represents a value that is calculated by dividing resistance of the electrode before the bend with resistance after the bend.

Even when a bending cycle exceeds 1000, as shown in FIG. 7, resistance of the electrode varies little, thereby confirming that the electrode according to the exemplary embodiment of the present invention can be used as a transparent conductive material.

As described above, according to the exemplary embodiment of the present invention, by forming the planarization layer including a conductive material on the electrode's surface and using the sacrificial layer including a hydrophobic material during the manufacturing process of the electrode, surface roughness and conductivity can be improved.

While this invention has been described in connection with what is presently considered to be practical exemplary embodiments, it is to be understood that the invention is not limited to the disclosed embodiments, but, on the contrary, is intended to cover various suitable modifications and equivalent arrangements included within the spirit and scope of the appended claims and their equivalents.

DESCRIPTION OF SOME OF THE SYMBOLS

| | |
|---|---|
| 123: insulation substrate | 130: thin film transistor |
| 160: first electrode | 180: second electrode |
| 150: substrate | 151: sacrificial layer |
| 152: planarization layer | 153: nanomaterial |
| 155: polymer layer | |

What is claimed is:

1. A method of manufacturing an electrode comprising:
    forming a sacrificial layer comprising a hydrophobic material on a substrate;
    forming a planarization layer comprising a conductive material and a surfactant on the sacrificial layer;
    coating a conductive nanomaterial on the planarization layer to have at least a portion of the conductive nanomaterial be exposed out of the planarization layer;
    forming a polymer layer by coating and curing a curable polymer on the planarization layer and on the conductive nanomaterial to have the exposed portion of the conductive nanomaterial be embedded in the polymer layer; and
    removing the substrate.

2. The method of claim 1, wherein the planarization layer further comprises:
    polyethylenedioxythiophene:polystyrenesulfonate (PEDOT:PSS); and
    a fluorine-based surfactant.

3. The method of claim 2, wherein the conductive nanomaterial comprises a metal nanowire comprising at least one of silver (Ag), copper (Cu), gold (Au), platinum (Pt), palladium (Pd), chromium (Cr), nickel (Ni), or aluminum (Al).

4. The method of claim 3, wherein the sacrificial layer comprises at least one of polymethyl methacrylate (PMMA), a photosensitive polymer (PR), or polyvinyl phenol (PVP).

5. The method of claim 4, wherein the curable polymer is cured by heat treatment for about 90 min. to about 150 min. at about 65° C. to about 75° C.

6. The method of claim 4, wherein the polymer layer comprises at least one of polyimide (PI), polyethylene terephthalate (PET), polyethersulfone (PES), polyethylene naphthalate (PEN), polycarbonate (PC), polymethyl methacrylate (PMMA), polyvinyl alcohol (PVA), triacetyl cellulose (TAC), polystyrene (PS), polyether imide (PEI), polydimethylsiloxane (PDMS), a silicone resin, a fluorine resin, or an epoxy resin.

* * * * *